(12) United States Patent
Hsu et al.

(10) Patent No.: US 11,976,170 B2
(45) Date of Patent: May 7, 2024

(54) POLYBENZOXAZOLE PRECURSOR AND APPLICATION THEREOF

(71) Applicant: MICROCOSM TECHNOLOGY CO., LTD., Tainan (TW)

(72) Inventors: Steve Lien-chung Hsu, Tainan (TW); Yu-Ching Lin, Tainan (TW); Yu-Chiao Shih, Tainan (TW); Hou-Chieh Cheng, Tainan (TW)

(73) Assignee: MICROCOSM TECHNOLOGY CO., LTD., Tainan (TW)

( * ) Notice: Subject to any disclaimer, the term of this patent is extended or adjusted under 35 U.S.C. 154(b) by 11 days.

(21) Appl. No.: 17/857,827

(22) Filed: Jul. 5, 2022

(65) Prior Publication Data

US 2023/0041833 A1    Feb. 9, 2023

(30) Foreign Application Priority Data

Jul. 9, 2021   (TW) .................................. 110125312

(51) Int. Cl.
| | | |
|---|---|---|
| *G03F 7/039* | (2006.01) | |
| *C08G 69/40* | (2006.01) | |
| *C08G 69/48* | (2006.01) | |
| *C08G 73/22* | (2006.01) | |
| *H01L 23/532* | (2006.01) | |

(52) U.S. Cl.
CPC ............. *C08G 69/40* (2013.01); *C08G 69/48* (2013.01); *C08G 73/22* (2013.01); *G03F 7/039* (2013.01); *G03F 7/0392* (2013.01); *H01L 23/5329* (2013.01)

(58) Field of Classification Search
CPC .... G03F 7/0392; G03F 7/0397; G03F 7/0045; C08G 69/40; C08G 69/48; C08G 73/22
See application file for complete search history.

(56) References Cited

U.S. PATENT DOCUMENTS

| | | | | |
|---|---|---|---|---|
| 2007/0099111 | A1* | 5/2007 | Naiini ................... | G03F 7/0392 430/270.1 |
| 2009/0197067 | A1* | 8/2009 | Naiini ...................... | G03F 7/40 430/326 |
| 2018/0118887 | A1* | 5/2018 | Shibuya ............. | C08G 73/1042 |

* cited by examiner

*Primary Examiner* — John S Chu
(74) *Attorney, Agent, or Firm* — Cermak Nakajima & McGowan LLP; Shelly Guest Cermak

(57) ABSTRACT

The present invention provides a polybenzoxazole precursor, which comprises a structure of formula (I):

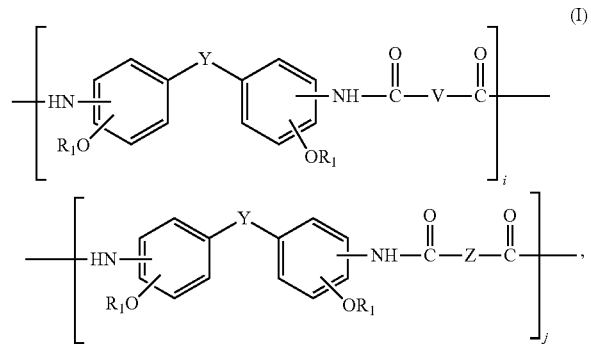

wherein the definitions of Y, Z, $R_1$, i, j, and V are provided herein. By means of the polybenzoxazole precursor, the resin composition of the present invention is able to form a film with high frequency characteristics and high contrast.

13 Claims, No Drawings

POLYBENZOXAZOLE PRECURSOR AND APPLICATION THEREOF

This application claims priority under 35 U.S.C. § 119 to Taiwanese Patent Application No. 110125312, filed Jul. 9, 2021, the entirety of which is incorporated by reference herein.

BACKGROUND OF THE INVENTION

Field of the Invention

The present invention relates to a polybenzoxazole precursor and, in particular, to a polybenzoxazole precursor that can be used to form a film with high frequency characteristics.

Description of the Prior Art 5G high-frequency communication technology must include the characteristics of high-frequency transmission, wide connection and low delay. It is an important issue to develop a material with low dissipation factor and apply the material to high-frequency signal transmission, wherein the dielectric constant (Dk) and the dissipation factor (Df) of the material are important factors that affect transmission speed and signal quality. On the other hand, for the semiconductor device, the trend is mainly towards the miniaturization of chips or wafer packaging materials, and the commonly used method is using the photosensitive resin in the lithography process to achieve the required fine circuit pattern.

The photosensitive resin compositions are generally divided into positive-type and negative-type photosensitive resin compositions. In the miniaturization process of patterned cured films, the positive-type photosensitive resin compositions have the advantages of high sensitivity and high resolution. However, in addition to considering the resolution of the pattern, the requirement of high dissolution contrast between the unexposed area and the exposed area should also be considered. Traditionally, the positive-type photosensitive resin composition using a combination of naphthoquinone diazide compound and an alkali-soluble resin can reduce the dissolution rate of the unexposed area, but increase of the ratio of naphthoquinone diazide compound will cause the transmittance of the exposure area to become lower at the same photosensitive wavelength, and the developing time is too long, which causes the problems of reduced resolution and lower dissolution contrast. In addition, the polar molecular structure of the naphthoquinone diazide compound itself will make the patterned cured film formed from the positive-type photosensitive resin composition have poor dielectric loss characteristics.

SUMMARY OF THE INVENTION

In view of the above technical problems, an object of the present invention is to provide a resin composition that can be used to form a film with high frequency characteristics and high contrast.

To achieve the above object, the present invention provides a polybenzoxazole precursor, which comprises a structure of formula (I):

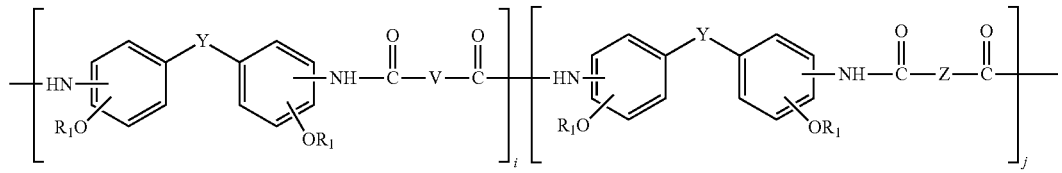

wherein
- Y is each independently a divalent group;
- Z is each independently a divalent residue of a dicarboxylic acid compound;
- $R_1$ is each independently hydrogen or a group represented by formula (II):

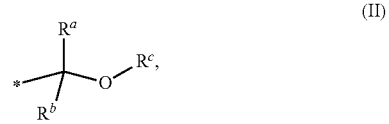

wherein an amount of the group represented by formula (II) in $R_1$ is 25-65 mol %, and $R^a$, $R^b$ and $R^c$ are each independently hydrogen, alkyl, alicyclic, aryl, heteroalicyclic, heteroaryl, heteroarylalkyl or arylalkyl; or $R^b$, a carbon atom bound to $R^b$, $R^c$, and an oxygen atom bound to $R^c$ together form an oxygen-containing heteroalicyclic ring;
- i is 20 to 100 mol %, j is 0 to 80 mol %, and the sum of i and j is 100 mol %; and
- V is each independently a group represented by formula (III):

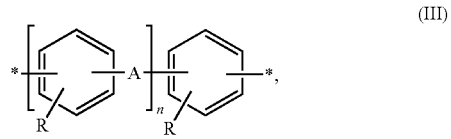

wherein A is each independently —CH$_2$—, —C(CH$_3$)$_2$—, —O—, —S—, —(S=O)—, —S(O)$_2$— or —C(CF$_3$)$_2$—; R is each independently hydrogen, alkyl, fluoroalkyl, alkoxy, fluoroalkoxy, a siloxane group, cycloalkyl, cycloalkoxy, alkylcycloalkoxy, fluoroalkyl cycloalkoxy, cycloalkylsulfonyl, alkylcycloalkylsulfonyl, fluoroalkylcycloalkylsulfonyl, aryl, aryloxy, alkylaryloxy, fluoroalkylaryloxy, arylsulfonyl, alkylarylsulfonyl, or fluoroalkylarylsulfonyl; and n is 0 or 2.

Preferably, Y is selected from —CH$_2$—, —C(CH$_3$)$_2$—, —O—, —S—, —(S=O)—, —S(O)$_2$- or —C(CF$_3$)$_2$—.

Preferably, the dicarboxylic acid compound is selected from an aliphatic dicarboxylic acid compound or an aromatic dicarboxylic acid compound.

More preferably, the aliphatic dicarboxylic acid compound is selected from malonic acid, dimethylmalonic acid, maleic acid, dimethylmaleic acid, succinic acid, glutaric acid, 2,2-dimethylglutaric acid, adipic acid, 2,3-diethyl succinic acid, 2-methyladipic acid, trimethyladipic acid, pimelic acid, suberic acid, azelaic acid, decanedioic acid, undecanedioic acid, dodecanedioic acid, 1,4-cyclohexanedicarboxylic acid or 1,3-cyclopentanedicarboxylic acid.

More preferably, the aromatic dicarboxylic acid compound is selected from terephthalic acid, isophthalic acid, 2,6-naphthalene dicarboxylic acid, 2,7-naphthalene dicarboxylic acid, 1,4-naphthalene dicarboxylic acid, 4,4'-diphenyl ether dicarboxylic acid, diphenyl methanone-4,4'-dicarboxylic acid, diphenyl sulfone-4,4'-dicarboxylic acid or 4,4'-biphenyldicarboxylic acid.

Preferably, the group represented by formula (II) is selected from

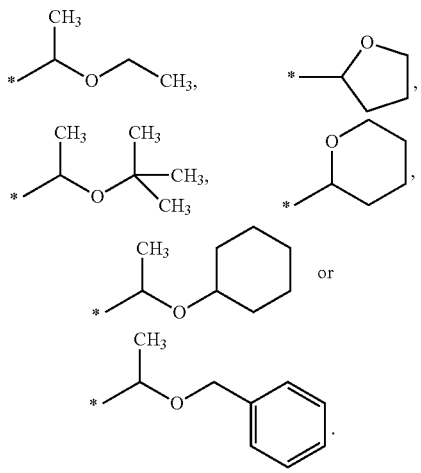

Preferably, the group represented by formula (III) is selected from

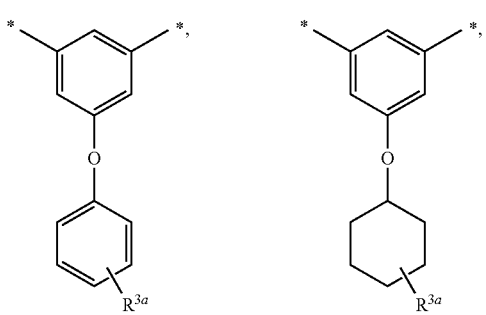

wherein R$^{3a}$ is each independently hydrogen, alkyl or fluoroalkyl.

The present invention also provides a resin composition, which comprises: a polymer comprising at least one of the aforementioned polybenzoxazole precursor and the polybenzoxazole obtained by cyclization of the aforementioned polybenzoxazole precursor; a photoacid generator; and an aprotic polar solvent.

Preferably, the resin composition further comprises a thermal acid generator.

Preferably, a dissipation factor of a film formed from the resin composition at 10 GHz is less than 0.01.

Preferably, an analytical size of a film formed from the resin composition is less than 10 μm.

Preferably, a loss rate of film thickness in an unexposed area calculated according to the following formula before and after development of a film formed from the resin composition is less than 25%:

loss rate of film thickness in unexposed area (%)= (film thickness before development−film thickness after development)/film thickness before development.

The present invention further provides an interlayer insulating film, which is a cured film obtained by curing the aforementioned resin composition.

The present invention also provides a semiconductor device, which comprises the aforementioned interlayer insulating film.

In the present invention, the novel dicarboxylic acid is introduced into the polybenzoxazole precursor so that the dissolution rate of the polybenzoxazole precursor in an alkaline developer (e.g., 2.38% tetramethylammonium hydroxide) can be significantly reduced due to the side chain structure and molecular chain length of the dicarboxylic acid. In addition, the present invention also introduces a specific protective group into the polybenzoxazole precursor to protect the phenolic hydroxyl group in the precursor, so that the polybenzoxazole precursor is insoluble in the alkaline aqueous solution. In this way, when the polybenzoxazole precursor is collocated with the photoacid generator, the resin composition formed can produce a chemical amplification effect after the exposure and development process, thereby improving the overall dissolution contrast. In addition, due to the low polarity of the protecting group used in the present invention, the low dissipation factor characteristic of the polybenzoxazole precursor can also be maintained.

BRIEF DESCRIPTION OF THE DRAWINGS

None

DETAILED DESCRIPTION OF THE EMBODIMENTS

In the present invention, "*" indicates a linking point.

In the present invention, the "divalent residue of a dicarboxylic acid compound" refers to the divalent group remaining after the two carboxyl groups (—COOH) of the dicarboxylic acid compound are removed. Examples are given below:

In formula (I), each occurrence of Y may be the same or different and can be a divalent group. Preferably, Y is selected from —$CH_2$—, —$C(CH_3)_2$—, —O—, —S—, —(S=O)—, —$S(O)_2$— or —$C(CF_3)_2$—.

In formula (I), each occurrence of Z may be the same or different and can be a divalent residue of a dicarboxylic acid compound. Preferably, the dicarboxylic acid compound is selected from an aliphatic dicarboxylic acid compound or an aromatic dicarboxylic acid compound. Examples of the aliphatic dicarboxylic acid compound include, but are not limited to, malonic acid, dimethylmalonic acid, maleic acid, dimethylmaleic acid, succinic acid, glutaric acid, 2,2-dimethylglutaric acid, adipic acid, 2,3-diethyl succinic acid, 2-methyladipic acid, trimethyladipic acid, pimelic acid, suberic acid, azelaic acid, decanedioic acid, undecanedioic acid, dodecanedioic acid, 1,4-cyclohexanedicarboxylic acid and 1,3-cyclopentanedicarboxylic acid. Examples of the aromatic dicarboxylic acid compound include, but are not limited to, terephthalic acid, isophthalic acid, 2,6-naphthalene dicarboxylic acid, 2,7-naphthalene dicarboxylic acid, 1,4-naphthalene dicarboxylic acid, 4,4'-diphenyl ether dicarboxylic acid, diphenyl methanone-4,4'-dicarboxylic acid, diphenyl sulfone-4,4'-dicarboxylic acid and 4,4'-biphenyldi

| Dicarboxylic acid compound | Divalent residue of a dicarboxylic acid compound |
|---|---|
| Decanedioic acid: | |
| 4,4'-diphenyl ether dicarboxylic acid: | |

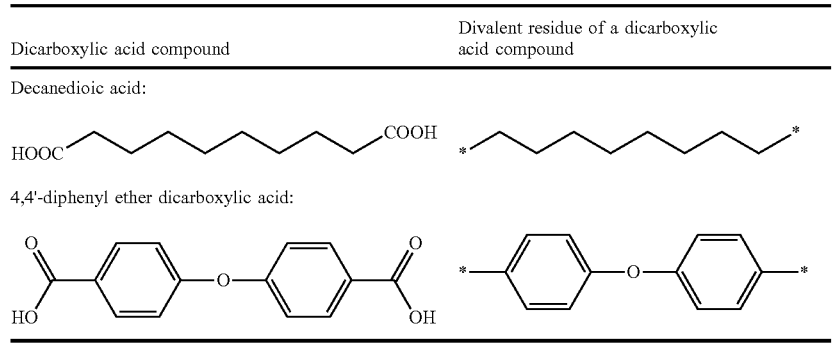

The resin composition provided by the present invention includes a polymer comprising at least one of the polybenzoxazole precursor and a polybenzoxazole obtained by cyclization of the polybenzoxazole precursor; a photoacid generator; and an aprotic polar solvent.

In the present invention, the polybenzoxazole precursor comprises a structure of formula (I):

carboxylic acid. When synthesizing the polybenzoxazole precursor of the present invention, these carboxylic acid compounds can be used alone or in combination of two or more (such as three or four).

In formula (I), each occurrence of $R_1$ may be the same or different and can be hydrogen or a group represented by formula (II):

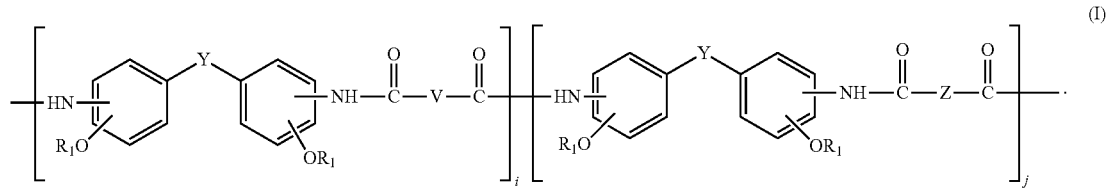

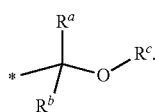

(II)

In formula (I), an amount of the group represented by formula (II) in $R_1$ is 25-65 mol %, preferably 35-55 mol %. $R^a$, $R^b$ and $R^c$ are each independently (i.e. each occurrence may be the same or different) hydrogen, alkyl, alicyclic, aryl, heteroalicyclic, heteroaryl, heteroarylalkyl or arylalkyl; or $R^b$, a carbon atom bound to $R^b$, $R^c$, and an oxygen atom bound to $R^c$ together form an oxygen-containing heteroalicyclic ring. Examples of alkyl include, but are not limited to, methyl, ethyl, propyl, butyl (such as isobutyl, tert-butyl), pentyl and hexyl. Preferably, the alkyl group is methyl, ethyl, propyl or butyl. Examples of alicyclic include, but are not limited to, cycloalkyl (such as cyclobutyl, cyclopentyl, cyclohexyl, cycloheptyl), cycloalkenyl (such as cyclopentenyl, cyclohexenyl). Examples of aryl include, but are not limited to, phenyl and naphthyl. The heteroalicyclic group may be a 5-membered heteroalicyclic group, a 6-membered heteroalicyclic group or a 7-membered heteroalicyclic group. Examples of heteroalicyclic include, but are not limited to, tetrahydrofuranyl (such as 2-tetrahydrofuranyl), tetrahydropyrrolyl, tetrahydropyranyl (such as 2-tetrahydropyranyl). Examples of heteroaryl include, but are not limited to, furyl, pyridyl and imidazolyl. Examples of the heteroarylalkyl include, but are not limited to, furylmethyl (such as 2-furylmethyl) and pyridylmethyl. Examples of the arylalkyl include, but are not limited to, benzyl, phenethyl, phenpropyl and phenbutyl. Examples of the oxygen-containing heteroalicyclic include, but are not limited to, tetrahydrofuranyl (such as 2-tetrahydrofuranyl) and tetrahydropyranyl (such as 2-furylmethyl).

In the present invention, the group represented by formula (II) mainly plays the role of a protecting group. The protective group will dissociate after reacting with the acid, so that the protected hydroxyl group or carboxylic acid group will be reduced, and the resin in the exposed area can be dissolved in an alkaline solution. The proportion of the protecting group used varies according to the structure derived from the dicarboxylic acid and the characteristics of the protecting group. Considering the dissolution rate, the proportion of the protecting group is preferably between 25 and 65 mol %, more preferably between 35 and 55 mol %. That is, the amount of hydrogen in $R_1$ is preferably 25-65 mol %, more preferably 35-55 mol % (such as 38-50 mol %, 39~50 mol %, 39~45 mol %), relative to the amount of the protecting group.

In a preferred embodiment, the group represented by formula (II) is selected from

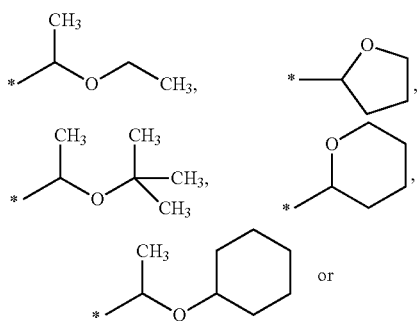

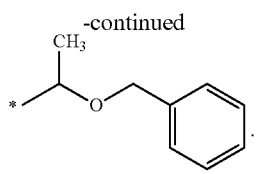

In formula (I), i is 20-100 mol %, j is 0-80 mol %, and the sum of i and j is 100 mol %. In certain embodiments, i is 40-100 mol %, and j is 0-60 mol %. In certain embodiments, i is 60-100 mol %, and j is 0-40 mol %. In certain embodiments, i is 20-80 mol %, and j is 20-80 mol %.

In formula (I), V is each independently (that is, each occurrence may be the same or different) a group of formula (III):

(III)

In formula (III), each occurrence of A may be the same or different, and can be —$CH_2$—, —$C(CH_3)_2$—, —O—, —S—, —(S=O)—, —$S(O)_2$— or —$C(CF_3)_2$—.

In formula (III), each occurrence of R may be the same or different, and can be hydrogen, alkyl (such as methyl, ethyl, propyl, butyl), fluoroalkyl (such as $CF_3$, $CF_3$—$CH_2$—, $CF_3$—$CF_3$—), alkoxy (such as methoxy, ethoxy, propoxy, butoxy), fluoroalkoxy (such as $CF_3$—O—, $CF_3$—$CH_2$—O—, $CF_3$—$CF_2$—O—), siloxane group, cycloalkyl (such as cyclobutyl, cyclopentyl, cyclohexyl), cycloalkoxy, alkylcycloalkoxy, fluoroalkylcycloalkoxy, cycloalkylsulfonyl, alkylcycloalkylsulfonyl, fluoroalkylcycloalkylsulfonyl, aryl (such as phenyl, naphthyl), aryloxy, alkylaryloxy, fluoroalkylaryloxy, arylsulfonyl, alkylarylsulfonyl or fluoroalkylarylsulfonyl; and n is 0 or 2.

The term "cycloalkoxy" used in the present invention refers to —OE group, wherein E refers to cycloalkyl. Examples of cycloalkoxy include, but are not limited to, cyclobutoxy, cyclopentyloxy and cyclohexyloxy.

The term "alkylcycloalkoxy" used in the present invention refers to a cycloalkoxy group substituted with an alkyl group. Examples of alkylcycloalkoxy include, but are not limited to, methylcyclobutoxy, methylcyclopentyloxy, methylcyclohexyloxy, ethylcyclobutoxy, ethylcyclopentyloxy, ethylcyclohexyloxy and propylcyclohexyloxy.

The term "fluoroalkylcycloalkoxy" used in the present invention refers to a cycloalkoxy group substituted with a fluoroalkyl group. Examples of fluoroalkylcycloalkoxy include, but are not limited to, trifluoromethylcyclobutoxy, trifluoromethylcyclopentyloxy and trifluoromethylcyclohexyloxy.

The term "cycloalkylsulfonyl" used in the present invention refers to —$S(O)_2$-E, wherein E refers to cycloalkyl. Examples of cycloalkylsulfonyl include, but are not limited to, cyclobutylsulfonyl, cyclopentylsulfonyl, cyclohexylsulfonyl and cycloheptylsulfonyl.

The term "alkylcycloalkylsulfonyl" used in the present invention refers to a cycloalkylsulfonyl group substituted with an alkyl group. Examples of alkylcycloalkylsulfonyl include, but are not limited to, methylcyclobutylsulfonyl, methylcyclopentylsulfonyl, methylcyclohexylsulfonyl, methylcycloheptylsulfonyl, ethylcyclohexylsulfonyl and propylcyclohexylsulfonyl.

The term "fluoroalkylcycloalkylsulfonyl" used in the present invention refers to a cycloalkylsulfonyl group substituted with a fluoroalkyl group. Examples of fluoroalkylcycloalkylsulfonyl include, but are not limited to, trifluoromethylcyclobutylsulfonyl, trifluoromethylcyclopentylsulfonyl, trifluoromethylcyclohexylsulfonyl, trifluoromethylcycloheptylsulfonyl, trifluoroethylcyclohexylsulfonyl and trifluoropropylcyclohexylsulfonyl.

The term "aryloxy" used in the present invention refers to a —OAr group, wherein Ar refers to an aryl group. Examples of aryloxy include, but are not limited to, phenoxy and naphthoxy.

The term "alkylaryloxy" used in the present invention refers to an aryloxy group substituted with an alkyl group. Examples of alkylaryloxy include, but are not limited to, methylphenoxy, ethylphenoxy, propylphenoxy and methylnaphthoxy.

The term "fluoroalkylaryloxy" used in the present invention refers to an aryloxy group substituted with a fluoroalkyl group. Examples of fluoroalkylaryloxy include, but are not limited to, trifluoromethylphenoxy, trifluoroethylphenoxy, trifluoropropylphenoxy and trifluoromethylnaphthoxy.

The term "arylsulfonyl" used in the present invention refers to —S(O)$_2$—Ar, wherein Ar refers to an aryl group. Examples of arylsulfonyl include, but are not limited to, benzenesulfonyl and naphthylsulfonyl.

The term "alkylarylsulfonyl" used in the present invention refers to an arylsulfonyl group substituted with an alkyl group. Examples of alkylarylsulfonyl include, but are not limited to, methylbenzenesulfonyl, ethylbenzenesulfonyl, propylbenzenesulfonyl and methylnaphthalenesulfonyl.

The term "fluoroalkylarylsulfonyl" used in the present invention refers to an arylsulfonyl group substituted with a fluoroalkyl group. Examples of fluoroalkylarylsulfonyl include, but are not limited to, trifluoromethylbenzenesulfonyl, trifluoroethylbenzenesulfonyl, trifluoropropylbenzenesulfonyl and trifluoromethylnaphthalenesulfonyl.

In a preferred embodiment, the group represented by formula (III) is selected from:

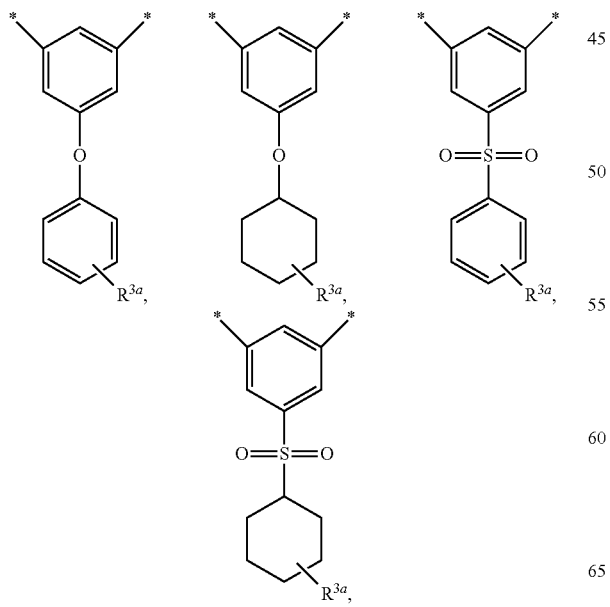

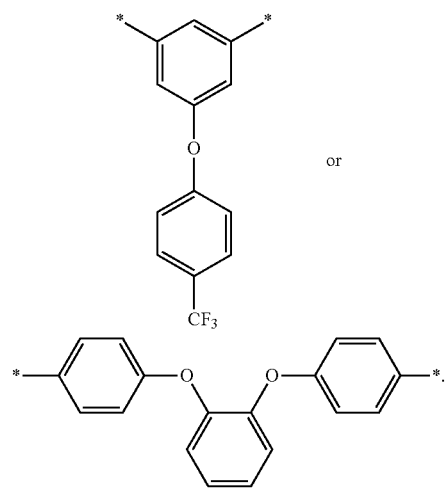

wherein $R^{3a}$ is each independently (that is, each occurrence of Ria may be the same or different) hydrogen, alkyl or fluoroalkyl. Examples of the alkyl include, but are not limited to, methyl, ethyl, propyl, butyl, pentyl and hexyl. Examples of the fluoroalkyl include, but are not limited to, trifluoromethyl, trifluoroethyl and trifluoropropyl.

In a more preferred embodiment, the group represented by formula (III) is selected from:

The polybenzoxazole precursor of the present invention can be prepared by the following method. The dicarboxylic acid monomer is subjected to chlorination, and then the obtained dichloride compound and bis(o-aminophenol) compound are subject to low temperature polycondensation reaction in the organic solvent to obtain polyhydroxyamide. Next, the polyhydroxyamide and the compound used to generate the protective group (for example, tert-butyl vinyl ether, ethyl vinyl ether, cyclohexyl isopropyl ether) are dissolved in the organic solvent for reaction, and the obtained solution is stirred and placed under a controlled temperature condition until the protection is completed (i.e, the reaction is completed), so as to obtain a polyhydroxyamide with the protecting group (i.e., a protected polyhydroxyamide).

The polybenzoxazole precursor of the present invention can be cyclized to form polybenzoxazole. Specifically, the polybenzoxazole precursor can be converted into polybenzoxazole by thermal ring closure or chemical ring closure. The method of cyclizing the polybenzoxazole precursor to form the polybenzoxazole can be accomplished by conventional methods, which will not be described here. The polybenzoxazole of the present invention can be synthesized by one-step or two-step method.

The photoacid generator can use common and commercially available products, and the main ultraviolet absorption wavelength is between 350 nm and 450 nm. Suitable photoacid generators may be onium salts or sulfonium salts, etc. Examples include, but are not limited to, aryldiazonium salts, diaryliodonium salts (such as diphenyliodonium salts), bis(alkylaryl)iodonium salts (such as bis(tert-butylphenyl) iodonium salts), trialkyl sulfonium salts (such as trimethyl sulfonium salts), dialkylmonoaryl sulfonium salts (such as dimethylphenyl sulfonium salts), diarylmonoalkyl sulfonium salts (such as diphenylmethyl sulfonium salts) and triaryl sulfonium salts. The photoacid generator is preferably 5-propylsulfonyloxyimino-5H-thienyl-2-alkylene-2-methylphenyl-acetonitrile, bis(p-toluenesulfonyl)diazonium methane, bis(1,1-dimethylhexylsulfonyl)diazomethane, 2-diazo-2-(p-toluenesulfonyl)acetate cyclohexyl ester or 2-diazo-2-benzenesulfonyl tertiary butyl acetate. These photoacid generators may be used alone or in combination of two or more (such as three or four) thereof. Based on the total weight of the resin composition, the content of the photoacid generator is preferably 1-30 wt %, more preferably 5-20 wt %.

In a preferred embodiment, the resin composition of the present invention further comprises a thermal acid generator. The thermal acid generator is an acid compound, which can be further derivatized into an ester or salt compound. Examples of the thermal acid generator include, but are not limited to, p-toluenesulfonic acid, methyl p-toluenesulfonate, pyridine-p-toluenesulfonate, m-hydroxybenzoic acid, p-hydroxybenzoic acid, o-hydroxybenzoic acid, 2,4-dihydroxybenzoic acid, p-hydroxybenzylcarboxylic acid, 3-(4-hydroxyphenyl)propionic acid, p-hydroxybenzenesulfonic acid, p-hydroxybenzenesulfonate, p-aminobenzoic acid, m-aminobenzoic acid, m-toluic acid, 1-hydroxy-2-naphthoic acid, 2-(4-hydroxyphenyl)-3-methylbutyric acid, 2-hydroxyacetic acid, 4-hydroxyisophthalic acid, 4-hydroxycinnamic acid, 3-(4-hydroxyphenyl)propionic acid, 4,5-dihydroxyphthalic acid, trifluoromethanesulfonate, boron trifluoride ether complex, hexafluorophosphate and perfluorobutane sulfonate. These thermal acid generators may be used alone or in combination of two or more thereof. Based on the total weight of the resin composition, the content of the thermal acid generator is preferably 0-10 wt %, more preferably 0-5 wt %, such as 1-5 wt %.

The aprotic polar solvent can use common and commercially available solvents, which can be selected from ethylene glycol monoalkyl ethers, ethylene glycol dialkyl ethers, ethylene glycol monoalkyl acetates, propylene glycol monoalkyl ethers, propylene glycol dialkyl ethers, propylene glycol monoalkyl acetates and propylene glycol dialkyl acetates. Examples of the aprotic polar solvent include: ethylene glycol butyl ether, ethylene glycol dimethyl ether, ethylene glycol ethyl acetate, propylene glycol methyl ether, propylene glycol dimethyl ether, propylene glycol ethyl acetate, propylene glycol dimethyl acetate, y-lactide and N-methylpyrrolidone, but are not limited thereto. These aprotic polar solvents can be used alone or in combination of two or more (such as three or four) thereof.

Without affecting the effect of the present invention, the resin composition may further include an additive according to its application requirements. The additive may be higher fatty acid derivatives, surfactants, inorganic particles, curing agents, curing catalysts, fillers, antioxidants, ultraviolet absorbers, anti-agglomeration agents, leveling agents or a combination of two or more (such as: three, four) of the above additives. The content of the additive is preferably set to 10% by mass or less of the solid content of the resin composition, such as 2 to 8% by mass. In certain embodiments, the resin composition does not contain the additive.

In a preferred embodiment, the resin composition is a positive-type photosensitive resin composition.

In a preferred embodiment, the dissipation factor of the film formed by the resin composition at 10 GHz is less than 0.01 (such as less than 0.007, less than 0.006, less than 0.005 or less than 0.0045). In a preferred embodiment, the analytical size of the film formed by the resin composition is less than 10 μm.

The resin composition of the present invention can be made into a cured film as an interlayer insulating film. The manufacturing method of the cured film may include the following steps: coating the resin composition on a substrate (which can be surface-cleaned) to obtain a coated substrate; surface-drying (which is a pre-baking step) the coated substrate at 80-120° C. (preferably 90-120° C., such as 95° C., 100° C., 105° C., 110° C. or 115° C.) for 1-5 minutes to obtain a surface-dried substrate; exposing the surface-dried substrate under a photomask to obtain an exposed substrate; baking the exposed substrate at 80-120° C. (preferably 90-120° C., such as 95° C., 100° C., 105° C., 110° C. or 115° C.) after exposure to form a film with a thickness of 10 μm; immersing the film in an alkaline aqueous solution as a developer (such as 2.38 wt % tetramethylammonium hydroxide (TMAH)) at room temperature for 30 to 90 seconds to remove unnecessary parts and form a patterned film; and post-baking the patterned film to obtain a cured film.

The light used for the exposure is preferably ultraviolet rays (such as g-line, h-line, i-line), and the amount of light used for the exposure is preferably 100 to 500 mJ/cm². The ultraviolet irradiation device can be a high pressure mercury lamp, an ultra-high pressure mercury lamp or a metal halide lamp. This post-baking treatment can be performed by heating means (such as a hot plate or oven). The temperature of the post-baking treatment is preferably 200 to 250° C.

Therefore, the present invention also provides an interlayer insulating film, which is a cured film obtained by curing the aforementioned resin composition.

The following further illustrates the present invention with examples, but it is not intended to limit the scope of the present invention, and, all changes and modifications made by people having ordinary skill in the art of the present invention without departing from the spirit of the present invention belong to the scope of the present invention.

Synthesis Example 1

Synthesis of Dicarboxylic Acid 1

A 500 mL three-necked reaction flask was set up in the fume hood; dimethyl sulfoxide as a solvent, potassium hydroxide (0.31 mol), 3,5-dimethylphenol (0.3 mol) and p-chlorbenzotrifluorid (0.32 mol) were added into the reaction flask; and the resulting mixture was heated to 145° C. under a nitrogen atmosphere for 3 hours. After the reaction was completed, the dimethyl sulfoxide was removed by distillation under reduced pressure, and the precursor of Dicarboxylic acid 1 can be obtained.

A 1000 mL three-necked reaction flask was set up in a fume hood; water as a solvent and the aforementioned precursor of Dicarboxylic acid 1 (1.5 mol) was added into the reaction flask; the resulting mixture was heated to 95° C. under a nitrogen atmosphere; and then 1.2 mol of potassium permanganate was added. After the addition was completed, the reaction was maintained at 95° C. for 2 hours. Afterwards, the temperature was lowered to 70° C., ethanol (20 mL) was added with continue stirring for 1 hour, and then unreacted potassium permanganate was removed. The resulting solution was distilled under reduced pressure to remove water, and a white solid product was precipitated from the solution after addition of excess hydrochloric acid. The solid product was washed with deionized water until the washing solution was neutral in pH value, and then recrystallization and purification were performed with ethanol/water. The resulting crystalline powder was placed in the vacuum oven and dried at 120° C. for 24 hours to obtain the purified Dicarboxylic acid 1.

$^{1}$H-NMR (500 MHz, DMSO-d$_6$, δ ppm) 7.26 ppm (2H, d, aromatic), 7.76 ppm (2H, d, aromatic), 7.80 ppm (2H, d, aromatic), 8.28 ppm (1H, s, aromatic).

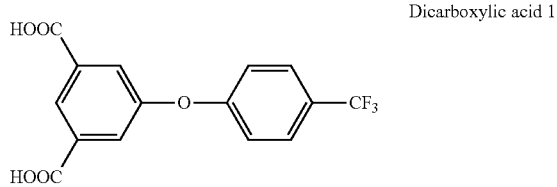 [SMILES: O=C(O)c1cc(Oc2ccc(C(F)(F)F)cc2)cc(C(=O)O)c1]

Dicarboxylic acid 1

Synthesis of Polyhydroxyamide 1

A 50 mL three-necked reaction flask was set up in a fume hood, and methylpyrrolidone as a solvent, dicarboxylic acid 1 (0.0021 mol) and decanedioic acid (0.0009 mol) were sequentially added into the reaction flask under a nitrogen atmosphere. After complete dissolution, the reaction temperature was controlled between 0° C. and 4° C. using an ice bath, and thionyl chloride (0.0075 mol) was slowly added. After complete addition, the ice bath was removed to return the reaction temperature to room temperature, and then the reaction was continued for another one hour to obtain the acyl chloride product.

A 100 mL three-necked reaction flask was set up on a mechanical stirrer, and methylpyrrolidone as a solvent and 2,2-bis(3-amino-4-hydroxyphenyl)-hexafluoropropane (0.003 mol) were sequentially added into the reaction flask under a nitrogen atmosphere. After complete dissolution, the reaction temperature was controlled between 0° C. and 4° C. using an ice bath, and propylene oxide (0.006 mol) was slowly added. After complete addition, the aforementioned acyl chloride product was slowly poured into the reaction flask, the reaction temperature was maintained between 0° C. and 4° C., stirring was continued for 1 hour, then the ice bath was removed, and the reaction was carried out at room temperature for 24 hours.

After 24 hours of reaction, the reaction solution was directly poured into deionized water, so that the solid product was precipitated. The solid product was washed 5 times using deionized water and then washed once using 50% methanol aqueous solution. The resulting solid product was placed in an oven and dried at 80° C. for 24 hours to obtain Polyhydroxyamide 1.

Synthesis of Polyhydroxyamide 1 with Protecting Group (A-1-T*)

A 100 mL three-necked reaction flask was set up in a fume hood, and diethylene glycol dimethyl ether as a solvent and the above Polyhydroxyamide 1 (0.003 mol) were sequentially added into the reaction flask under a nitrogen atmosphere. After complete dissolution, tert-butyl vinyl ether (0.0024 mol) was added with continue stirring for 10 min. Next, the reaction temperature was controlled between 0° C. and 4° C. using an ice bath, and p-toluenesulfonic acid (0.03 g) was slowly added. After complete addition, the ice bath was removed, and the reaction was carried out at room temperature for 5 hours. After the reaction was complete, the reaction solution was directly poured into deionized water, so that the solid product was precipitated. The solid product was washed 5 times using deionized water. The resulting solid product was placed in an oven and dried at 60° C. for 24 hours to obtain Polyhydroxyamide 1 with a protecting group (A-1-T*), wherein the protecting group (R$_1$) was

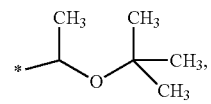

and the proportion of OR,-substituted hydroxyl (—OH) was 40 mol %.

Synthesis Example 2

Synthesis of Dicarboxylic Acid 2

A 250 mL three-necked reaction flask was set up in the fume hood, dimethylformamide (as a solvent), toluene (as a solvent), potassium carbonate (0.176 mol) and catechol (0.88 mol) were added into the reaction flask, and the temperature was raised to reflux temperature under a nitrogen atmosphere. The toluene and water were azeotropically distilled by the Dean-Stark apparatus. After the toluene was removed, p-fluorobenzonitrile (0.176 mol) was added, and the temperature was raised to 150° C. for 3 hours. After the reaction was completed, the solution was directly poured into deionized water to precipitate a white solid product, and the dried product was recrystallized from methanol. The resulting crystal powder was placed in an oven and dried at 60° C. for 12 hours to obtain the precursor of Dicarboxylic acid 2.

A 500 mL three-necked reaction flask was set up in the fume hood, the mixed solution of ethanol and water (1:1) was used as a solvent, the mixed solution, the aforementioned precursor of Dicarboxylic acid 2 (0.0545 mol) and potassium hydroxide (1.09 mol) were added into the reaction flask, and the temperature was raised to 90° C. under a nitrogen atmosphere to react for 24 hours. The mixed solution after the reaction was filtered, excess hydrochloric acid was added, and then a white solid was precipitated from the filtrate and dried at 80° C. for 24 hours to obtain Dicarboxylic acid 2.

$^1$H-NMR (500 MHz, DMSO-ds, 6 ppm) 6.91 ppm (4H, d, aromatic), 7.31 ppm (4H, d, aromatic), 7.35 ppm (4H, d, aromatic), 7.90 ppm (4H, d, aromatic).

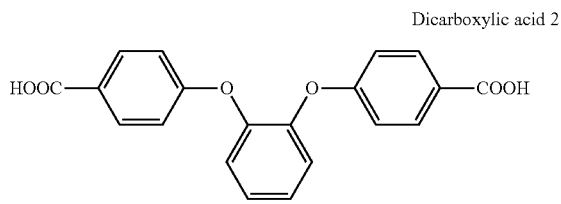 [SMILES: O=C(O)c1ccc(Oc2ccccc2Oc2ccc(C(=O)O)cc2)cc1]

Dicarboxylic acid 2

Synthesis of Polyhydroxyamide 2

A 50 mL three-necked reaction flask was set up in a fume hood, and methylpyrrolidone as a solvent, Dicarboxylic acid 2 (0.0021 mol) and decanedioic acid (0.0009 mol) were sequentially added into the reaction flask under a nitrogen atmosphere. After complete dissolution, the reaction temperature was controlled between 0° C. and 4° C. using an ice bath, and thionyl chloride (0.0075 mol) was slowly added. After complete addition, the ice bath was removed to return the reaction temperature to room temperature, and then the reaction was continued for another one hour to obtain the acyl chloride product.

A 100 mL three-necked reaction flask was set up on a mechanical stirrer, and methylpyrrolidone as a solvent and 2,2-bis(3-amino-4-hydroxyphenyl)-hexafluoropropane (0.003 mol) were sequentially added into the reaction flask under a nitrogen atmosphere. After complete dissolution, the reaction temperature was controlled between 0° C. and 4° C. using an ice bath, and propylene oxide (0.006 mol) was slowly added. After complete addition, the aforementioned acyl chloride product was slowly poured into the reaction flask, the reaction temperature was maintained between 0° C. and 4° C., stirring was continued for 1 hour, then the ice bath was removed, and the reaction was carried out at room temperature for 24 hours.

After 24 hours of reaction, the reaction solution was directly poured into deionized water, so that the solid product was precipitated. The solid product was washed 5 times using deionized water and then washed once using 50% methanol aqueous solution. The resulting solid product was placed in an oven and dried at 80° C. for 24 hours to obtain Polyhydroxyamide 2.

Synthesis of Polyhydroxyamide 2 with protecting group (A-2-T*)

A 100 mL three-necked reaction flask was set up in a fume hood, and diethylene glycol dimethyl ether as a solvent and the above Polyhydroxyamide 2 (0.003 mol) were sequentially added into the reaction flask under a nitrogen added with continue stirring for 10 min. Next, the reaction temperature was controlled between 0° C. and 4° C. using an ice bath, and p-toluenesulfonic acid (0.03 g) was slowly added. After complete addition, the ice bath was removed, and the reaction was carried out at room temperature for 5 hours. After the reaction was completed, the reaction solution was directly poured into deionized water, so that the solid product was precipitated. The solid product was washed 5 times using deionized water. The resulting solid product was placed in an oven and dried at 60° C. for 24 hours to obtain Polyhydroxyamide 2 with a protecting group (A-2-T*), wherein the protecting group ($R_1$) was

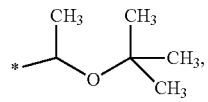

and the proportion of $OR_1$-substituted hydroxyl was 40 mol %.

Synthesis Example 3

Synthesis of Polyhydroxyamide 3

The synthesis steps are the same as that of Synthesis of Polyhydroxyamide 1 in Synthesis Example 1, except that Dicarboxylic acid 1 (0.0021 mol) and decanedioic acid (0.0009 mol) were replaced with Dicarboxylic acid 1 (0.0015 mol) and decanedioic acid (0.0015 mol) to obtain Polyhydroxyamide 3.

Synthesis of Polyhydroxyamide 3 with protecting group (A-3-T*)

A 100 mL three-necked reaction flask was set up in a fume hood, and diethylene glycol dimethyl ether as a solvent and the above Polyhydroxyamide 3 (0.003 mol) were sequentially added into the reaction flask under a nitrogen added with continue stirring for 10 min. Next, the reaction temperature was controlled between 0° C. and 4° C. using an ice bath, and p-toluenesulfonic acid (0.03 g) was slowly added. After complete addition, the ice bath was removed, and the reaction was carried out at room temperature for 5 hours. After the reaction was completed, the reaction solution was directly poured into deionized water, so that the solid product was precipitated. The solid product was washed 5 times using deionized water. The resulting solid product was placed in an oven and dried at 60° C. for 24 hours to obtain Polyhydroxyamide 3 with a protecting group (A-3-T*), wherein the protecting group ($R_1$) was

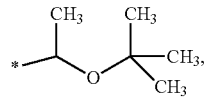

and the proportion of $OR_1$-substituted hydroxyl was 40 mol %.

Synthesis Example 4

Synthesis of Polyhydroxyamide 4

The synthesis steps are the same as that of Synthesis of Polyhydroxyamide 1 in Synthesis Example 1, except that Dicarboxylic acid 1 (0.0021 mol) and decanedioic acid (0.0009 mol) were replaced with Dicarboxylic acid 1 (0.0009 mol) and decanedioic acid (0.0021 mol) to obtain Polyhydroxyamide 4.

Synthesis of Polyhydroxyamide 4 with protecting group (A-4-T*)

A 100 mL three-necked reaction flask was set up in a fume hood, and diethylene glycol dimethyl ether as a solvent and the above Polyhydroxyamide 4 (0.003 mol) were sequentially added into the reaction flask under a nitrogen added with continue stirring for 10 min. Next, the reaction temperature was controlled between 0° C. and 4° C. using an ice bath, and p-toluenesulfonic acid (0.03 g) was slowly added. After complete addition, the ice bath was removed, and the reaction was carried out at room temperature for 5 hours. After the reaction was completed, the reaction solution was directly poured into deionized water, so that the solid product was precipitated. The solid product was washed 5 times using deionized water. The resulting solid product was placed in an oven and dried at 60° C. for 24 hours to obtain Polyhydroxyamide 4 with a protecting group (A-4-T*), wherein the protecting group ($R_1$) was

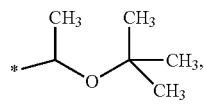

and the proportion of $OR_1$-substituted hydroxyl was 40 mol %.

Synthesis Example 5

Synthesis of Polyhydroxyamide 5

The synthesis steps are the same as that of Synthesis of Polyhydroxyamide 1 in Synthesis Example 1, except that Dicarboxylic acid 1 (0.0021 mol) and decanedioic acid (0.0009 mol) were replaced with Dicarboxylic acid 1 (0.0021 mol) and 4,4-oxybisbenzoic acid (0.0009 mol) to obtain Polyhydroxyamide 5.

Synthesis of Polyhydroxyamide 5 with protecting group (A-5-T*)

A 100 mL three-necked reaction flask was set up in a fume hood, and diethylene glycol dimethyl ether as a solvent and the above Polyhydroxyamide 5 (0.003 mol) were sequentially added into the reaction flask under a nitrogen added with continue stirring for 10 min. Next, the reaction temperature was controlled between 0° C. and 4° C. using an ice bath, and p-toluenesulfonic acid (0.03 g) was slowly added. After complete addition, the ice bath was removed, and the reaction was carried out at room temperature for 5 hours. After the reaction was completed, the reaction solution was directly poured into deionized water, so that the solid product was precipitated. The solid product was washed 5 times using deionized water. The resulting solid product was placed in an oven and dried at 60° C. for 24 hours to obtain Polyhydroxyamide 5 with a protecting group (A-5-T*), wherein the protecting group ($R_1$) was

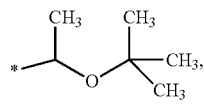

and the proportion of OR,-substituted hydroxyl was 40 mol %.

Comparative Examples

Synthesis Example 6

Synthesis of Polyhydroxyamide 6

The synthesis steps are the same as that of Synthesis of Polyhydroxyamide 1 in Synthesis Example 1, except that Dicarboxylic acid 1 (0.0021 mol) and decanedioic acid (0.0009 mol) were replaced with Dicarboxylic acid 1 (0.0003 mol) and decanedioic acid (0.0027 mol).

Synthesis of Polyhydroxyamide 6 with protecting group (B-1-T*)

A 100 mL three-necked reaction flask was set up in a fume hood, and diethylene glycol dimethyl ether as a solvent and the above Polyhydroxyamide 6 (0.003 mol) were sequentially added into the reaction flask under a nitrogen added with continue stirring for 10 min. Next, the reaction temperature was controlled between 0° C. and 4° C. using an ice bath, and p-toluenesulfonic acid (0.03 g) was slowly added. After complete addition, the ice bath was removed, and the reaction was carried out at room temperature for 5 hours. After the reaction was completed, the reaction solution was directly poured into deionized water, so that the solid product was precipitated. The solid product was washed 5 times using deionized water. The resulting solid product was placed in an oven and dried at 60° C. for 24 hours to obtain Polyhydroxyamide 6 with a protecting group (B-1-T*), wherein the protecting group ($R_1$) was

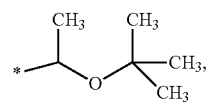

and the proportion of $OR_1$-substituted hydroxyl was 40 mol %.

Synthesis Example 7

Synthesis of Polyhydroxyamide 7 with DNQ protection (B-2-D)

A 100 mL three-necked reaction flask was set up in a fume hood, and diethylene glycol dimethyl ether as a solvent and the above Polyhydroxyamide 6 (0.003 mol) were sequentially added into the reaction flask under a nitrogen atmosphere. After complete dissolution, 1,2-naphthoquinonediazide-5-sulfonyl chloride (DNQ-5, 0.0012 mol) was added with continue stirring for 10 min, and triethylamine (0.0015 mmol) was added to react at room temperature for 5 hours. After the reaction was completed, the reaction solution was directly poured into deionized water, so that the solid product was precipitated. The solid product was washed 5 times using deionized water. The resulting solid product was placed in an oven and dried at 60° C. for 24 hours to obtain Polyhydroxyamide 7 with DNQ protection (B-2-D), and the proportion of OR,-substituted hydroxyl was 20 mol %.

Synthesis Example 8

Synthesis of Polyhydroxyamide 8

A 50 mL three-necked reaction flask was set up in a fume hood, and methylpyrrolidone (as a solvent) and 4,4-diphenyletherdicarboxylic acid (0.003 mol) were sequentially added into the reaction flask under a nitrogen atmosphere. After complete dissolution, the reaction temperature was controlled between 0° C. and 4° C. using an ice bath, and thionyl chloride (0.0075 mol) was slowly added. After complete addition, the ice bath was removed to return the reaction temperature to room temperature, and then the reaction was continued for another 1.5 hour to obtain the acyl chloride product.

A 100 mL three-necked reaction flask was set up on a mechanical stirrer, and methylpyrrolidone (as a solvent) and 2,2-bis(3-amino-4-hydroxyphenyl)-hexafluoropropane (0.003 mol) were sequentially added into the reaction flask under a nitrogen atmosphere. After complete dissolution, the reaction temperature was controlled between 0° C. and 4° C. using an ice bath, and propylene oxide (0.006 mol) was slowly added. After complete addition, the aforementioned acyl chloride product was slowly poured into the reaction flask, the reaction temperature was maintained between 0° C. and 4° C., stirring was continued for 1.5 hour, then the ice bath was removed, and the reaction was carried out at room temperature for 24 hours.

After 24 hours of reaction, the reaction solution was directly poured into deionized water, so that the solid product was precipitated. The solid product was washed 5 times using deionized water and then washed once using 50% methanol aqueous solution. The resulting solid product was placed in an oven and dried at 80° C. for 24 hours to obtain Polyhydroxyamide 8.

Synthesis of Polyhydroxyamide 8 with protecting group (B-3-T*)

A 100 mL three-necked reaction flask was set up in a fume hood, and diethylene glycol dimethyl ether (as a solvent) and the above Polyhydroxyamide 8 (0.003 mol) were sequentially added into the reaction flask under a nitrogen atmosphere. After complete dissolution, tert-butyl vinyl ether (0.0024 mol) was added with continue stirring for 10 min. Next, the reaction temperature was controlled between 0° C. and 4° C. using an ice bath, and p-toluenesulfonic acid (0.03 g) was slowly added. After complete addition, the ice bath was removed, and the reaction was carried out at room temperature for 5 hours. After the reaction was completed, the reaction solution was directly poured into deionized water, so that the solid product was precipitated. The solid product was washed 5 times using deionized water. The resulting solid product was placed in an oven and dried at 60° C. for 24 hours to obtain Polyhydroxyamide 8 with a protecting group (B-3-T*), wherein the protecting group ($R_1$) was

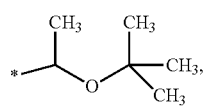

and the proportion of $OR_1$-substituted hydroxyl was 40 mol %.

Example: Preparation of Positive-Type Photosensitive Resin Composition

According to the dosages listed in Table 1, Components (A) to (D) were uniformly mixed, filtered with a 5 μm filter head, and then subject to defoaming treatment with a defoaming machine to obtain the resin compositions of Examples 1 to 5 and Comparative Examples 1 to 4.

Component (A) represents the polyhydroxyamide with a protecting group in each synthesis example. Component (B) represents a photoacid generator (5-propylsulfonyloxy-imino-5H-thienyl-2-alkylene-2-methylphenyl-acetonitrile, PTMA, Hangzhou GYZ Chemical). Component (C) represents a thermal acid generator (methyl p-toluenesulfonate, MpTOL, Sigma-Aldrich). Component (D) represents y-lactide (GBL).

After the resin composition was coated, exposed and developed and then post-baked into a film at 250° C., the following methods were used for evaluation: Dielectric constant (Dk)

The standard method of IPC-TM-650-2.5.5.9 was used for measurement under the condition of 10 GHz using a measuring instrument (brand: Agilent; model: HP4291).

Dissipation Factor (Df)

The standard method of IPC-TM-650-2.5.5.9 was used for measurement under the condition of 10 GHz using a measuring instrument (brand: Agilent; model: HP4291).

The resolution of the 10 μm film thickness includes: the analytical size and the loss rate of film thickness in unexposed area.

After exposure and development, the minimum sizes of the pattern line width and space (line spacing) were used as the basis for calculating the analytical size. The analytical size was calculated by US, where L referred to the line width; and S referred to the line spacing.

When L/S was 10 μm or less, the resolution was high and was evaluated as o.

When L/S was greater than 10 μm, the resolution was low and was evaluated as x.

Loss rate of film thickness in unexposed area (%)

The film thicknesses of the unexposed area before and after development were measured, and their difference was divided by the film thickness of the unexposed area before development to obtain the loss rate of film thickness in unexposed area. The formula is as follows:

Loss rate of film thickness in unexposed area (%)= (film thickness before development−film thickness after development)/film thickness before development When the loss rate of film thickness in unexposed area was less than 25%, it was evaluated as o.

When the loss rate of film thickness in unexposed area was in the range of 25~50%, it was evaluated as Δ.

When the loss rate of film thickness in unexposed area was more than 50%, it was evaluated as x.

The above evaluation results are shown in Table 1.

TABLE 1

| Components of resin composition | | Ex. 1 | Ex. 2 | Ex. 3 | Ex. 4 | Ex. 5 | Comp. Ex. 1 | Comp. Ex. 2 | Comp. Ex. 3 | Comp. Ex. 4 |
|---|---|---|---|---|---|---|---|---|---|---|
| Component (A) | A-1-T* | 12 | 0 | 0 | 0 | 0 | 0 | 0 | 0 | 0 |
| | A-2-T* | 0 | 12 | 0 | 0 | 0 | 0 | 0 | 0 | 0 |
| | A-3-T* | 0 | 0 | 12 | 0 | 0 | 0 | 0 | 0 | 0 |
| | A-4-T* | 0 | 0 | 0 | 12 | 0 | 0 | 0 | 0 | 0 |
| | A-5-T* | 0 | 0 | 0 | 0 | 12 | 0 | 0 | 0 | 0 |
| | B-1-T* | 0 | 0 | 0 | 0 | 0 | 12 | 0 | 0 | 0 |
| | B-2-D | 0 | 0 | 0 | 0 | 0 | 0 | 12 | 0 | 0 |
| | B-3-T* | 0 | 0 | 0 | 0 | 0 | 0 | 0 | 12 | 12 |
| Component (B) | PTMA | 1.2 | 1.2 | 1.2 | 1.2 | 1.2 | 1.2 | 1.2 | 1.2 | 3.6 |
| Component (C) | MpTOL | 0.12 | 0.12 | 0.12 | 0.12 | 0.12 | 0.12 | 0.12 | 0.12 | 0.12 |
| Component (D) | GBL | 86.68 | 86.68 | 86.68 | 86.68 | 86.68 | 86.68 | 86.68 | 86.68 | 84.28 |
| Dielectric properties | Dk | 2.84 | 2.86 | 2.82 | 2.81 | 2.88 | 2.85 | 2.92 | 3.21 | 3.24 |
| | Df | 0.0041 | 0.0041 | 0.004 | 0.0038 | 0.0065 | 0.0033 | 0.012 | 0.01 | 0.017 |
| Resolution of 10 µm film thickness | Analytical size | ○ | ○ | ○ | ○ | ○ | X | X | ○ | ○ |
| | Loss rate of unexposed film | ○ | ○ | ○ | ○ | ○ | Δ | ○ | X | Δ |

Notes:
1. T* represents the protecting group developed in the present invention.
2. D represents the commercially available DNQ photosensitive protecting group.

As shown in Table 1, compared with Comparative Examples 3 and 4, Examples 1, 2, and 5 have lower loss rates of film thickness in unexposed areas. This is because a novel dicarboxylic acid is introduced into the polybenzoxazole precursor of the present invention to include the group represented by formula (III), and the side chain structure and/or molecular chain length of the group represented by formula (III) help to reduce the loss rate of film thickness in unexposed areas. In Comparative Example 4, the loss rate of film thickness in the unexposed area was slightly improved due to the increase of the content of the photoacid generator, but the dissipation factor was also increased due to the increase of the content of the photoacid generator, and was still greater than 0.01. In addition, compared with Comparative Examples 2-4, Examples 1-5 have a dissipation factor of less than 0.01.

From the comparison results of Examples 1, 3, 4 and Comparative Example 1, it can be seen that when the polymer in the resin composition contains two kinds of dicarboxylic acid units (i.e., structural unit i and structural unit j), the proportion of the structural unit i in polymer is reduced from 70, 50, 30, 10%, the dissipation factor of the film formed by the resin composition will decrease, but the loss rate of film thickness in the unexposed area will increase accordingly. In addition, it can be seen from the results of Comparative Example 2 that when the polymer in the resin composition is polyhydroxyamide with a DNQ protecting group, the film formed by the resin composition has a good loss rate of film thickness in the unexposed area, but its analytical size (greater than 10 µm) and dissipation factor (greater than 0.01) are not good.

It can be seen from the above that, according to the present invention, a resin composition capable of forming a film having high frequency characteristics, high resolution, high contrast and low temperature curing characteristics can be obtained.

The above are only the preferred embodiments of the present invention, and are not intended to limit the present invention. It should be pointed out that people having ordinary skill in the art can also make several improvements and modifications without departing from the technical principles of the present invention, and these improvements and modifications should also be regarded as the protection scope of the present invention.

The invention claimed is:

1. A polybenzoxazole precursor, comprising a structure of formula (I):

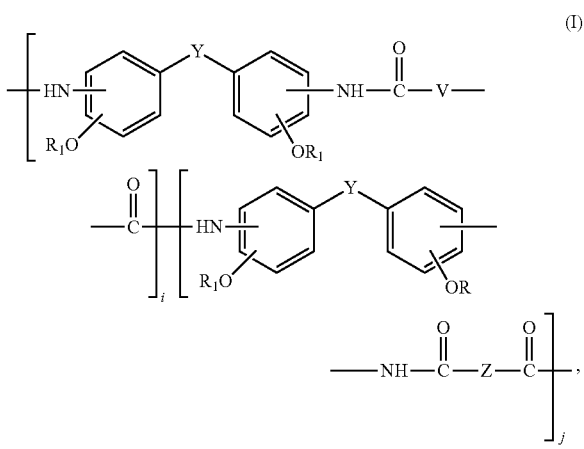

wherein
Y is each independently a divalent group;
Z is each independently a divalent residue of a dicarboxylic acid compound;
$R_1$ is each independently hydrogen or a group represented by formula (II):

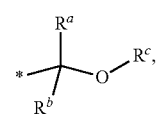

wherein an amount of the group represented by formula (II) in $R_1$ is 25-65 mol %, and $R^a$, $R^b$ and $R^c$ are each independently hydrogen, alkyl, alicyclic, aryl, heteroalicyclic, heteroaryl, heteroarylalkyl or arylalkyl; or $R^b$, a carbon atom bound to $R^b$, $R^c$, and an oxygen atom bound to R' together form an oxygen-containing heteroalicyclic ring;

i is 20 to 100 mol %, j is 0 to 80 mol %, and the sum of i and j is 100 mol %; and V is each independently a group represented by formula (III):

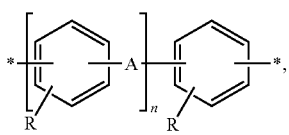

wherein A is each independently —CH$_2$—, —C(CH$_3$)$_2$—, —O—, —S—, —(S═O)—, —S(O)$_2$— or —C(CF$_3$)$_2$—; R is each independently hydrogen, alkyl, fluoroalkyl, alkoxy, fluoroalkoxy, a siloxane group, cycloalkyl, cycloalkoxy, alkylcycloalkoxy, fluoroalkyl cycloalkoxy, cycloalkylsulfonyl, al kylcy cl oal kyl sulfonyl, fluoroalkylcycloalkylsulfonyl, aryl, aryloxy, alkylaryloxy, fluoroalkylaryloxy, arylsulfonyl, alkylarylsulfonyl, or fluoroalkylarylsulfonyl; and n is 0 or 2, wherein the group represented by formula (III) is selected from

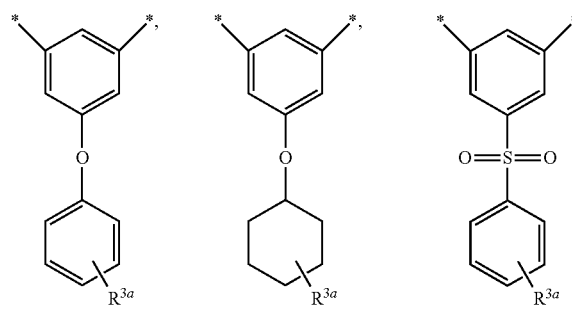

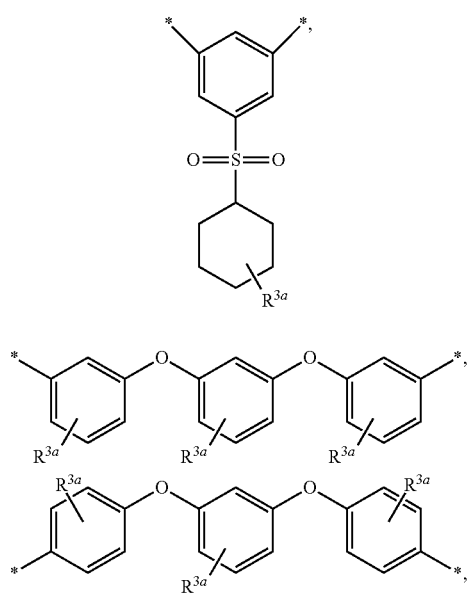

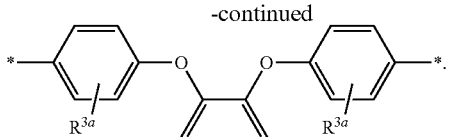

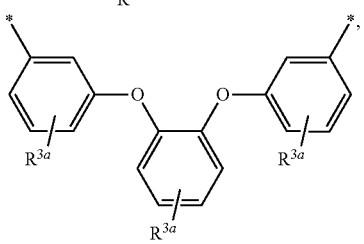

wherein $R^{3a}$ is each independently hydrogen, alkyl or fluoroalkyl.

2. The polybenzoxazole precursor of claim 1, wherein Y is selected from —CH$_2$—, —C(CH$_3$)$_2$—, —O—, —S—, —(S═O)—, —S(O)$_2$— or —C(CF$_3$)$_2$—.

3. The polybenzoxazole precursor of claim 1, wherein the dicarboxylic acid compound is selected from an aliphatic dicarboxylic acid compound or an aromatic dicarboxylic acid compound.

4. The polybenzoxazole precursor of claim 3, wherein the aliphatic dicarboxylic acid compound is selected from malonic acid, dimethylmalonic acid, maleic acid, dimethylmaleic acid, succinic acid, glutaric acid, 2,2-dimethylglutaric acid, adipic acid, 2,3-diethyl succinic acid, 2-methyladipic acid, trimethyladipic acid, pimelic acid, suberic acid, azelaic acid, decanedioic acid, undecanedioic acid, dodecanedioic acid, 1,4-cyclohexanedicarboxylic acid or 1,3-cyclopentanedicarboxylic acid.

5. The polybenzoxazole precursor of claim 3, wherein the aromatic dicarboxylic acid compound is selected from terephthalic acid, isophthalic acid, 2,6-naphthalene dicarboxylic acid, 2,7-naphthalene dicarboxylic acid, 1,4-naphthalene dicarboxylic acid, 4,4'-diphenyl ether dicarboxylic acid, diphenyl methanone-4,4'-dicarboxylic acid, diphenyl sulfone-4,4'-dicarboxylic acid or 4,4'-biphenyldicarboxylic acid.

6. The polybenzoxazole precursor of claim 1, wherein the group represented by formula (II) is selected from

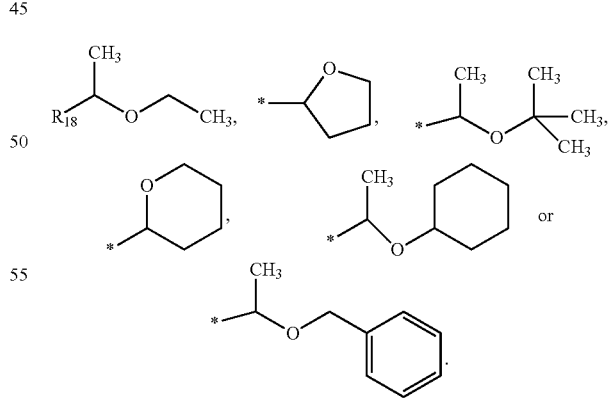

7. A resin composition comprising:
a polymer comprising at least one of the polybenzoxazole precursor of claim 1 and a polybenzoxazole obtained by cyclization of the polybenzoxazole precursor of claim 1;
a photoacid generator; and
an aprotic polar solvent.

8. The resin composition of claim 7, further comprising a thermal acid generator.

9. The resin composition of claim 7, wherein a dissipation factor of a film formed therefrom at 10 GHz is less than 0.01.

10. The resin composition of claim 7, wherein an analytical size of a film formed therefrom is less than 10 µm.

11. The resin composition of claim 7, wherein a film thickness loss rate of an unexposed area calculated according to the following formula before and after development of a film formed therefrom is less than 25%:

loss rate of film thickness in unexposed area (%)= (film thickness before development−film thickness after development)/film thickness before development.

12. An interlayer insulating film, which is a cured film obtained by curing the resin composition of claim 7.

13. A semiconductor device, comprising the interlayer insulating film of claim 12.

\* \* \* \* \*